United States Patent
Hsieh

(10) Patent No.: US 7,181,351 B2
(45) Date of Patent: Feb. 20, 2007

(54) STATUS INDICATOR AND STATUS INDICATING METHOD

(75) Inventor: Kuan-Hong Hsieh, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 51 days.

(21) Appl. No.: 11/081,957

(22) Filed: Mar. 16, 2005

(65) Prior Publication Data

US 2005/0240363 A1  Oct. 27, 2005

(30) Foreign Application Priority Data

Apr. 27, 2004 (TW) ............... 93111679 A

(51) Int. Cl.
*G01R 19/00* (2006.01)
*G01R 13/00* (2006.01)

(52) U.S. Cl. ............... 702/64; 702/66; 340/815.45

(58) Field of Classification Search .......... 702/64, 702/66, 65, 189; 340/815.45
See application file for complete search history.

(56) References Cited

U.S. PATENT DOCUMENTS 5,528,332 A * 6/1996 Furutsu .................. 396/147
6,068,352 A * 5/2000 Kulkarni et al. .......... 303/20
2002/0178388 A1  11/2002 Huppi et al.
2004/0196151 A1  10/2004 Smith

* cited by examiner

*Primary Examiner*—Michael Nghiem
*Assistant Examiner*—Meagan S Walling
(74) *Attorney, Agent, or Firm*—Morris Manning & Martin; Tim Tingkang Xia, Esq.

(57) ABSTRACT

A status indicator and status indicating method are provided to indicate multi-working statuses of an electronic device with a single status indicator. The status indicator includes an MCU (10, 10'), and an LED circuit. The MCU includes a CPU (101), a ROM (103), a RAM (105), a counter (107, 107') and an output port (111, 111'). In a first embodiment, the MCU further includes a PWM register (109). The CPU detects a current working status, and controls the PWM output port to output corresponding PWM waves via the PWM register according to the first embodiment, and executes an interrupt service routine stored in the ROM, thereby outputs corresponding PWM waves via the output port according to a second embodiment. The PWM waves are delivered to the LED circuit to make the LED indicate the current working status.

17 Claims, 4 Drawing Sheets

STATUS INDICATOR AND STATUS INDICATING METHOD

BACKGROUND OF THE INVENTION

1. Field of the Invention

The present invention relates to status indicators for electronic devices and related indicating methods, and particularly to an LED (light emitting diode) indicator and a related method for indicating different statuses of electronic devices.

2. Prior Art

LEDs have been widely employed as status indicators of electronic devices for a long time. In the early years, a main application of an LED indicator on an electronic device was to indicate the power status of the electronic device. That is, the LED indicator emits light when the electronic device is powered on, and goes out when the electronic device is powered off.

With today's advances in technologies, electronic devices have been equipped with more working statuses, such as "normal," "idle," "lock" and the like, each for the purpose of satisfying users, saving power and/or protecting the electronic devices. To indicate so many working statuses and make the users aware of the current working status, a plurality of LED indicators, each respectively indicating a special working status, are employed. For example, China patent no. 02270351.9, which is entitled "Televisions having status-indicators", discloses a technology that indicates multi-working statuses of a television using a plurality of LED indicators.

The indicating task of an electronic device is satisfactorily fulfilled by using a plurality of LED indicators. However, with the increase in the number of LEDs, the manufacturing cost of the electronic device is incrementally increased too.

Thus there is a need for a status indicator indicating multi-working statuses of an electronic device with a single LED, which not only successfully fulfills the indicator function but also effectively reduces the manufacturing cost of the electronic device.

SUMMARY OF THE INVENTION

Accordingly, a main objective of the present invention is to provide a status indicator which is capable of indicating multi-working statuses of an electronic device with a single LED (light-emitting diode).

Another objective of the present invention is to provide a status indicating method which is capable of utilizing a single LED to indicate multi-working statuses of an electronic device.

To accomplish the aforesaid main objective, an LED indicator is provided herein. The LED indicator is installed in an electronic apparatus and used to indicate a variety of different working statuses of the electronic apparatus. The LED indicator comprises a micro-programmable control unit (MCU) and a light-emitting diode (LED) circuit electrically connected to the MCU. The MCU is employed to produce PWM (pulse width modulation) waves to drive the LED circuit according to the working statuses of the electronic device. In a first embodiment, the MCU comprises a CPU (central processing unit), a PWM counter, a PWM register, and a PWM output port. The CPU detects in real time a current working status of the electronic device, and outputs a number of PWM unit period in the peak voltage level of each PWM waveform period of one type of PWM wave which corresponds to the current working status of the electronic device to the PWM register. Based upon time information obtained from the PWM counter, the PWM register controls the PWM output port to output the type of PWM wave having the aforesaid number of PWM unit periods in the peak voltage level of each PWM waveform period to the LED circuit, and thereby makes the LED incorporated in the LED circuit indicate the current working status.

In a second embodiment, the MCU comprises: a CPU; a nonvolatile memory for storing a interrupt service routine (ISR); a RAM for storing a number of elapsed PWM unit periods of a current PWM waveform period, and numbers of PWM unit periods in the peak voltage level of each PWM waveform period of all types of PWM waves; a counter for measuring time on the basis of PWM unit periods; and a output port. The CPU detects in real time a current working status of the electronic device and executes the ISR, thereby outputs PWM waves having the corresponding number of PWM unit periods in the peak voltage level of each PWM waveform period to the LED circuit through the output port.

To accomplish the aforesaid other objective, an LED indicating method is provided herein. The LED indicating method comprises the following steps: (a) detecting a current working status of the electronic device and obtaining a number of the PWM unit periods in the peak voltage level of each PWM waveform period of a type of PWM wave which corresponds to the current working status of the electronic device; (b) executing an interrupt service routine (ISR); and (c) emitting light at a lighting pattern which corresponds to the current working status of the electronic device.

Step (b) further comprises: (b1) determining whether a number of elapsed PWM unit periods of the current PWM waveform period is less than a number of PWM unit periods in the peak voltage level of each PWM waveform period of the type of PWM wave corresponding to the current working status of the electronic device; and (b2) outputting a peak voltage to an LED circuit if the determination is "yes;" or (b3) outputting a low voltage to the LED circuit if the determination is "no."

Other objects, advantages and novel features of the invention will become more apparent from the following detailed description when taken in conjunction with the accompanying drawings, in which:

DETAILED DESCRIPTION OF THE INVENTION

As a general overview, the present invention is provided to supply pulse-width modulation (PWM) waves having different duty cycles to a status indicator of an electronic device, and drive the status indicator to indicate different statuses of the electronic device. For simplicity and clarity, in the following detailed description, the status indicator is designated as an LED (lighting emitting diode) indicator. The LED indicator is installed on the electronic device and utilized to indicate a variety of different working statuses of the electronic device. Such working statuses may include but not be limited to: powering on, powering off, "normal" and "idle," and the like. Corresponding to each working status of the electronic device, the LED indicator outputs appropriate pulse-width modulation (PWM) waves to an LED incorporated therein, and thereby controls the LED to emit light according to an appropriate lighting mode (for example, blinking or continuous lighting) with an appropriate brightness. In the exemplary embodiments of the present invention, the PWM waves are differentiated by PWM waveforms which make up of the PWM waves. That is, each type of PWM waves corresponds to PWM waveforms with a unique duty cycle. As known by those skilled in the art, a PWM waveform is made up of a plurality of PWM waveform periods; a PWM waveform period, in turn, is formed by 255 PWM unit periods; and a PWM unit period is constituted by N clock periods. N is controllably variable, thus different PWM waveforms and different PWM waves are produced by varying the value of N. In the preferred embodiments, the appropriate PWM waves are obtained by altering the number of PWM unit periods in the peak voltage level of each PWM waveform period. In another words, the appropriate PWM waves are obtained by adjusting the duty cycles of the PWM waves.

Figure 1:
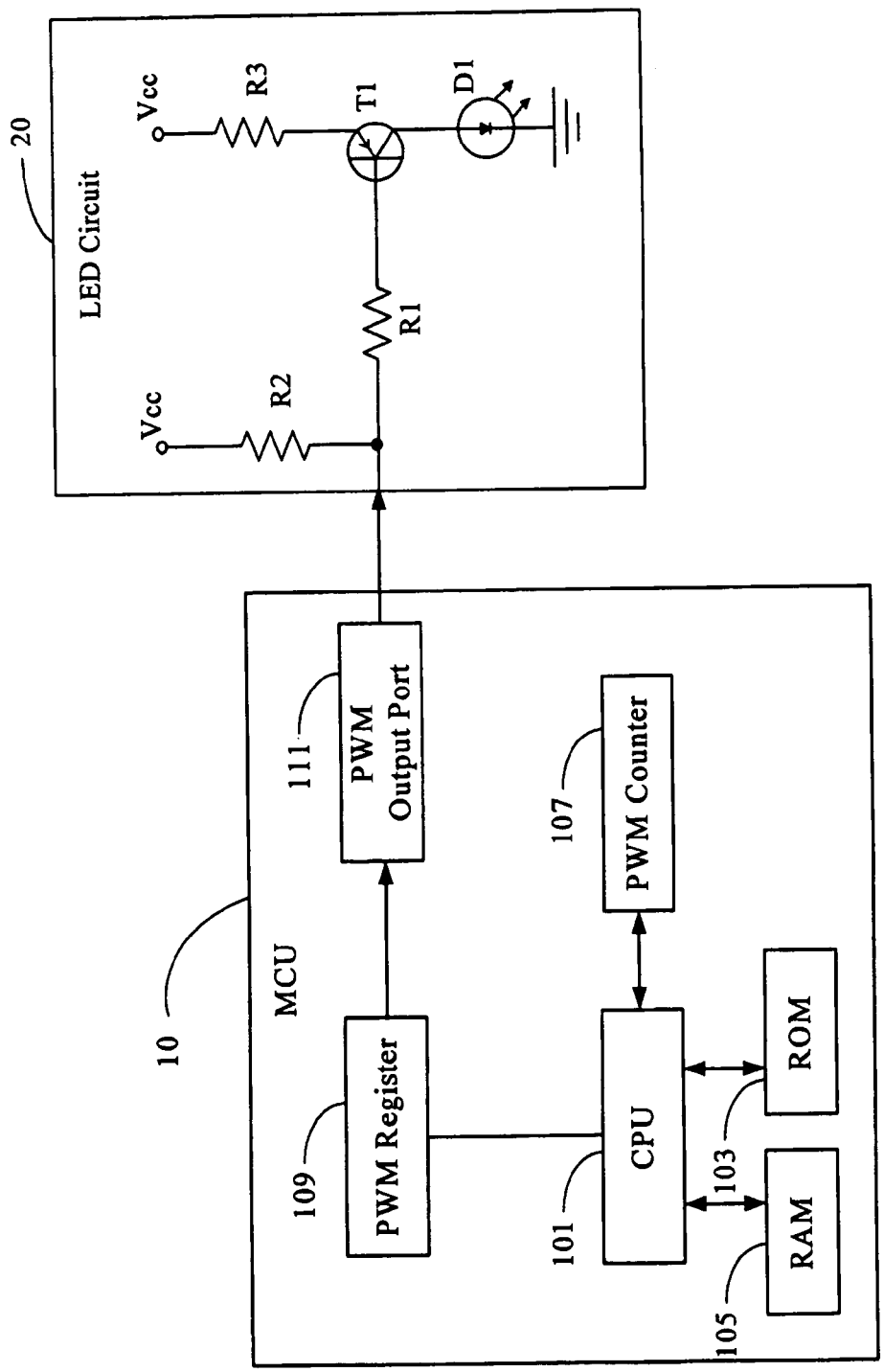
FIG. 1 is a block diagram of hardware infrastructure of a status indicator in accordance with a first embodiment of the present invention.

FIG. 1 is a block diagram of hardware infrastructure of a status indicator in accordance with the first embodiment of the present invention. In the first embodiment of the present invention, the LED indicator comprises an MCU (microprogrammable control unit) 10 and an LED circuit 20. The LED circuit 20 includes a driving circuit (not labeled) and an LED D1. The MCU 10 is employed to produce PWM (pulse width modulation) waves to drive the LED circuit 20 according to the working statuses of the electronic device. The MCU 10 comprises: a CPU (central processing unit) 101; a PWM output port 111; and a ROM (read-only memory) 103, a RAM (random access memory) 105, a PWM counter 107, and a PWM register 109, all of which are connected to the CPU 101 and controlled by the CPU 101. The ROM 103 may be replaced by any other suitable nonvolatile memory, such as a PROM (programmable read-only memory), an EPROM (erasable and programmable read-only memory), an EEPROM (electrically erasable programmable read-only memory), or a flash memory. The PWM counter 107 is used for measuring time on the basis of the PWM unit periods. The PWM register 109 is also connected with the PWM output port 111, and is for controlling the PWM output port 111 to output the PWM waves at a certain duty cycle.

The driving circuit is provided between the PWM output port 111 and the LED D1, and is used to deliver PWM waves to the LED D1 from the MCU 10. FIG. 1 shows an exemplary simplest form of the driving circuit, which includes three resistors R1, R2, R3, and a transistor T1. The transistor T1 has a base, a collector, and an emitter. The base is coupled to the PWM output port 111 via R1, and coupled to a voltage source Vcc via R1 and R2. The collector is grounded via D1. The emitter is coupled to the voltage source Vcc via R3. Through the driving circuit, the PWM waves output from the PWM output port 111 are delivered to the LED D1 to energize the LED D1. It should be noted that any other type of driving circuit, which operates in a similar manner and conducts the PWM waves to the LED effectively, can be made according to the present invention without departing from the spirit of the present invention.

The LED indicator works once the electronic device is powered on. The CPU 101 detects in real time the current working status of the electronic device, and outputs a number of PWM unit periods in the peak voltage level of a PWM waveform period which corresponds to the current working status of the electronic device to the PWM register 109. Based upon time information obtained from the PWM counter 107, the PWM register 109 controls the PWM output port 111 to output PWM waves at a corresponding duty cycle to the LED circuit 20, and thereby makes the LED D1 emit a corresponding lighting mode with a corresponding brightness.

Figure 2:
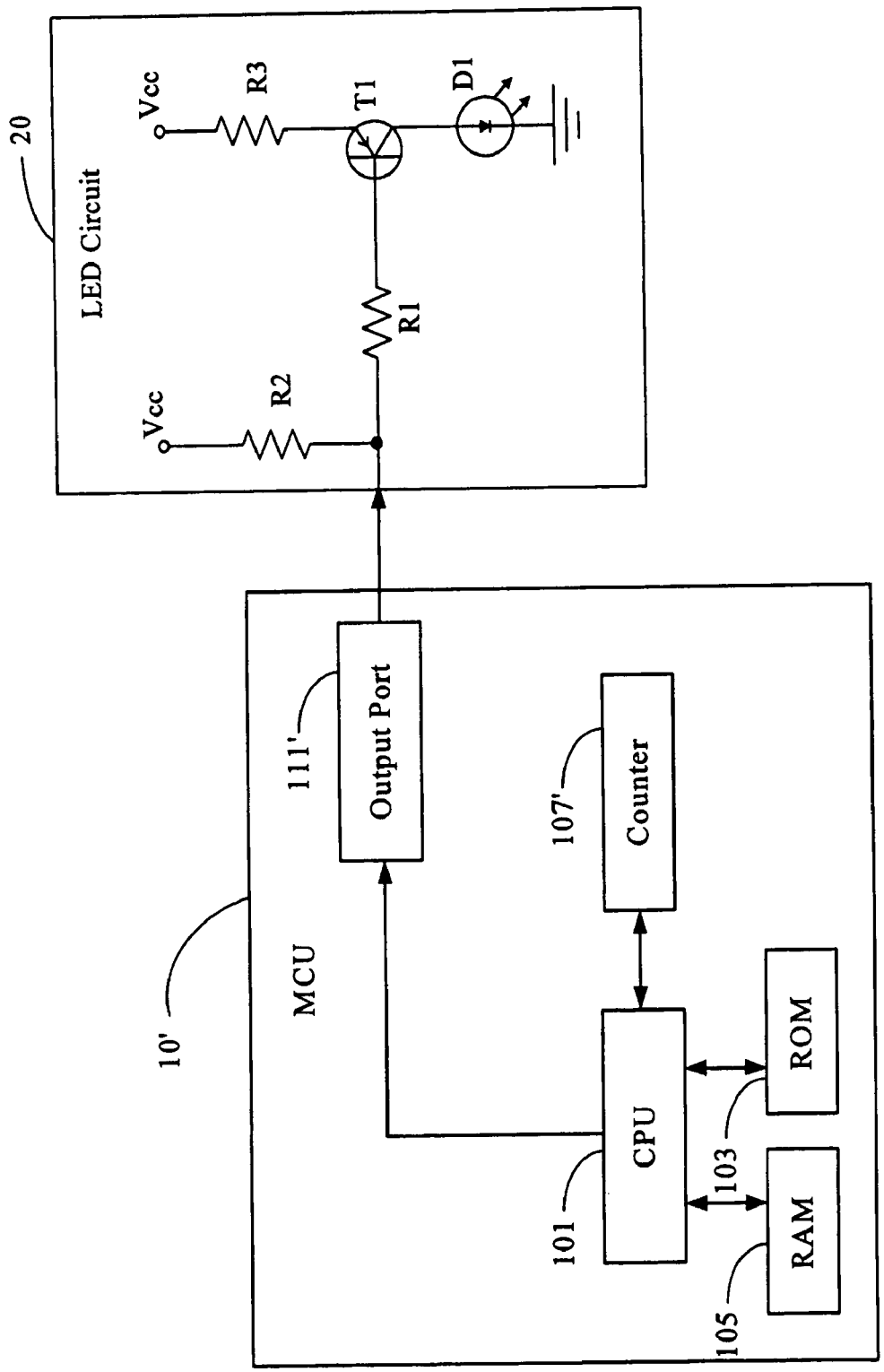
FIG. 2 is a block diagram of hardware infrastructure of a status indicator in accordance with a second embodiment of the present invention.

FIG. 2 is a block diagram of hardware infrastructure of a status indicator in accordance with the second embodiment of the present invention. In FIG. 2, like components to those of FIG. 1 have the same or a corresponding reference numeral. As seen in FIG. 2, the PWM register 109 of FIG. 1 is omitted, and a common counter 107' and a common output port 111' are respectively substituted for the PWM counter 107 and the PWM output port 111 of FIG. 1. The ROM 103 stores an interrupt service routine (ISR), and can be replaced by any other suitable nonvolatile memory, such as a PROM, an EPROM, an EEPROM, or a flash memory. The RAM 105 stores a number of elapsed PWM unit periods of a current PWM waveform period, and numbers of PWM unit periods in the peak voltage level of each PWM waveform period of all of types of PWM waves. The counter 107' is for measuring time on the basis of the PWM unit periods.

Figure 3:
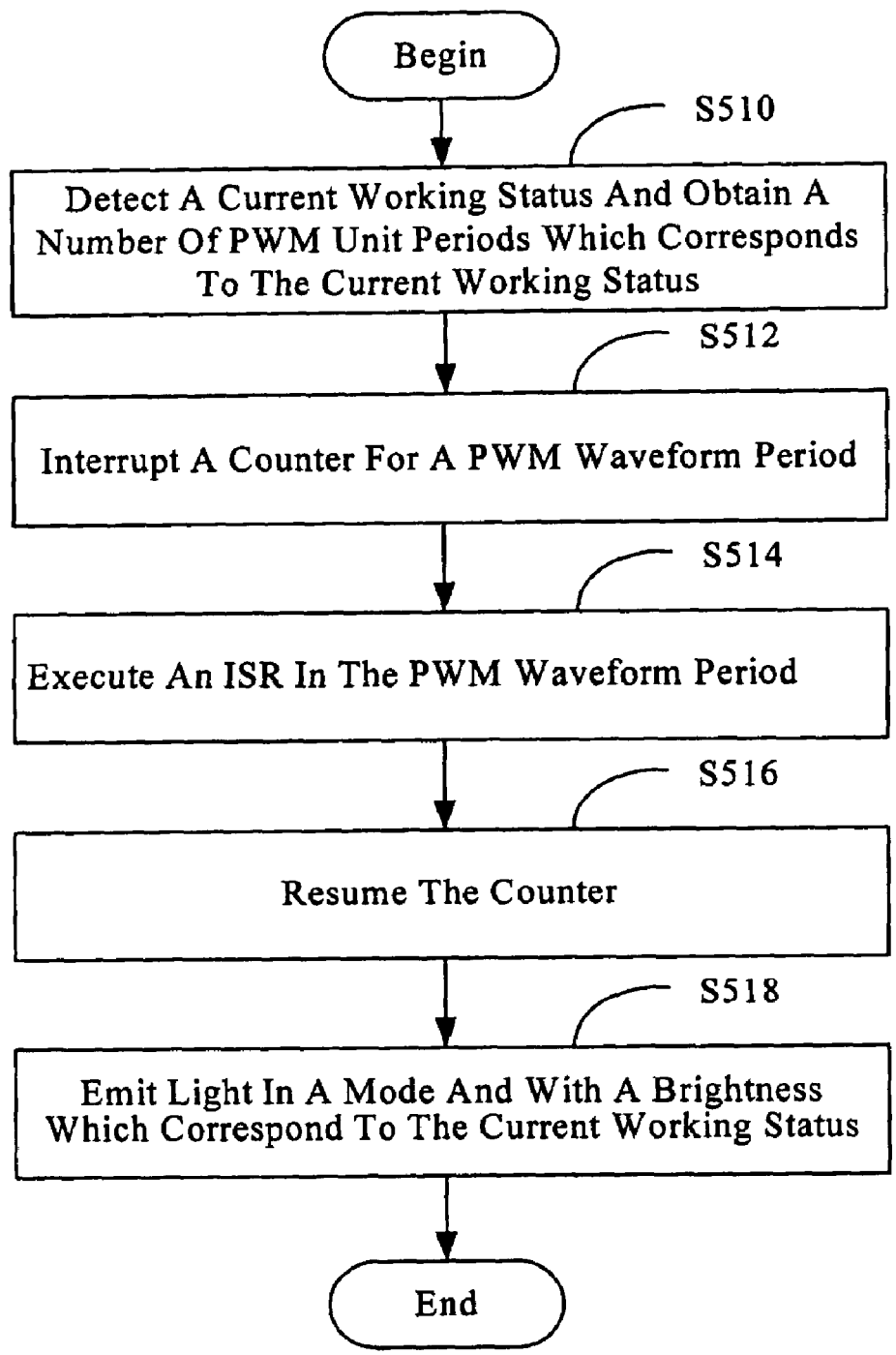
FIG. 3 is a flowchart of a preferred method for indicating different working statuses of an electronic device, using the status indicator in accordance with the second embodiment.

FIG. 3 is a flowchart of the preferred method for indicating multi-working statuses of an electronic device, which for the purposes of illustration is implemented using the status indicator in accordance with the second embodiment of the present invention. The procedure starts at the time when the electronic device is powered on. In step S510, the CPU 101 detects in real time a current working status of the electronic device, and obtains from the RAM 105 the number of PWM unit periods in the peak voltage level of each PWM waveform period which corresponds to the current working status. In step S512, the CPU 101 interrupts the counter 107' for a PWM waveform period in every preset interval. In step S514, the CPU 101 executes the ISR stored in the ROM 103 in said PWM waveform period. According to the preferred method, a PWM waveform period used is sufficiently shorter than that which can be effectively distinguished by the human eye. Thus, the execution of the ISR cannot be distinguished by users due to the limitations of human vision. In step S516, the CPU 101 resumes the counter 107. In step S518, the LED D1 emits light in a mode and with a brightness which correspond to the current working status of the electronic device.

Figure 4:
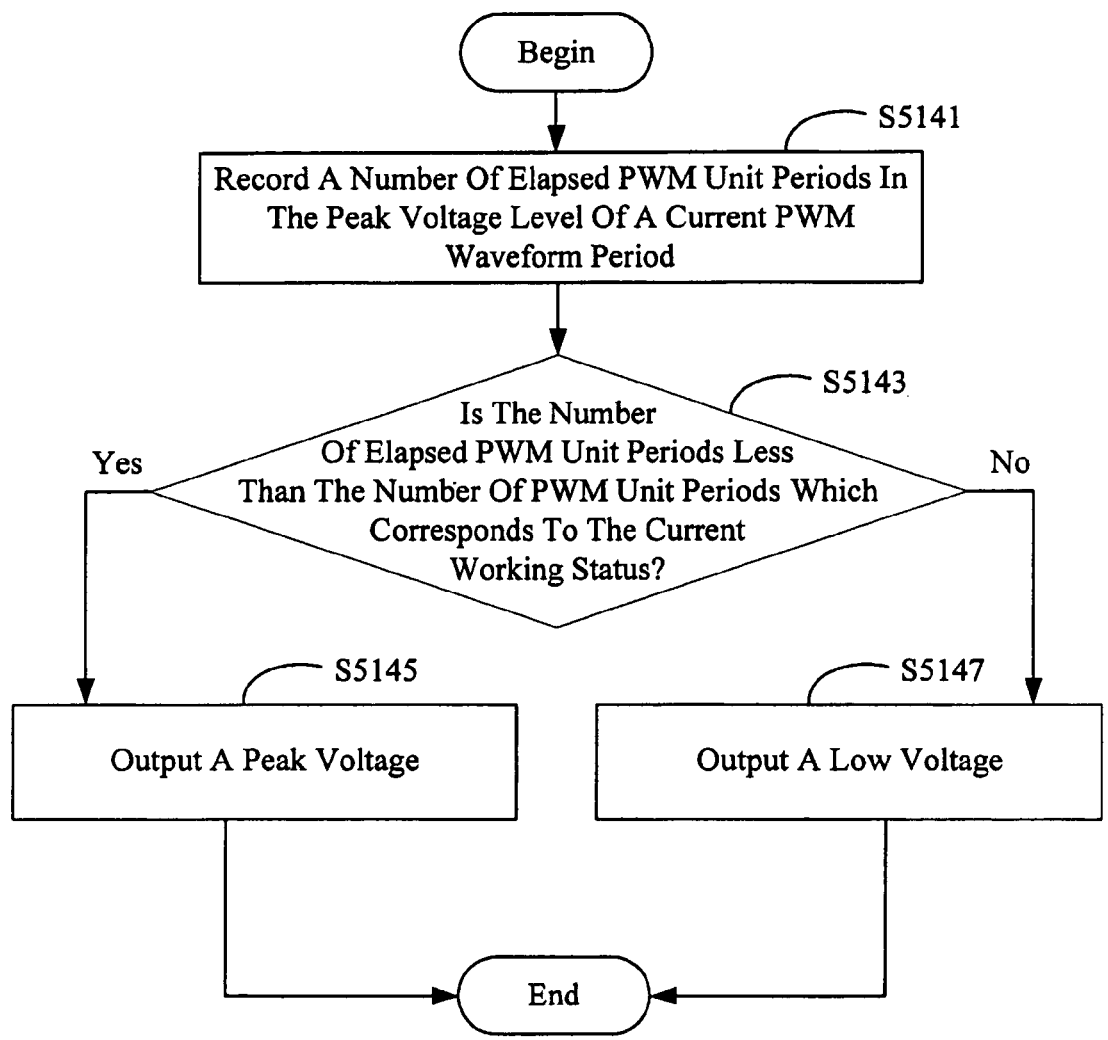
FIG. 4 is a flowchart of details of implementing one of the steps of FIG. 3, namely executing an interrupt service routine.

FIG. 4 is a flowchart of details of implementing step S514 of FIG. 3, namely executing the ISR stored in the ROM 103. In step S5141, the RAM 105 records a number of elapsed PWM unit periods in the peak voltage level of a current PWM waveform period. In step S5143, the CPU 101 determines whether the aforesaid number of elapsed PWM unit periods is less than the number of PWM unit periods in the peak voltage level of each PWM waveform period of the type of PWM waveform which corresponds to the current working status of the electronic device. If the determination is "yes," then in step S5145, the CPU 101 controls the output port 111' to output a peak voltage to the LED circuit 20, whereupon the procedure is finished. If the determination is "no", then in step S5147, the CPU 101 controls the output port 111' to output a low voltage to the LED circuit 20, whereupon the procedure is finished.

The procedure shown in FIGS. 3 and 4 repeats until the electronic device is powered off. Because the ISR is simple and is executed in a PWM waveform period, the human eye cannot detect the abnormality of the LED D1 while the counter 107' is interrupted. That is, execution of the ISR is not distinguished by users due to the limitations of human vision. Further, because the invention utilizes only one LED to indicate multi-working statuses of an electronic device, a simple structure and correspondingly low manufacturing costs are achieved.

Although the present invention has been specifically described on the basic of a preferred embodiment and a preferred method, the invention is not to be construed as being limited thereto. Various changes and modifications may be made to the embodiment and method without departing from the scope and the spirit of the invention.

What is claimed is:

1. A status indicator for indicating multi-working statuses of an electronic device, comprising a micro-programmable control unit (MCU), a light emitting device, and a driving circuit provided between the MCU and the light emitting device, wherein:
    the MCU is for producing and outputting pulse-width modulation (PWM) waves to the light emitting device via the driving circuit, the PWM waves having different types of PWM waveforms, each type of PWM waveform having a unique number of PWM unit periods in a peak voltage level of each PWM waveform period and corresponding to one working status of the electronic device, and the MCU comprises:
        a central processor unit (CPU) for detecting a current working status of the electronic device and controlling generation of the PWM waves having a selective type of PWM waveform that corresponds to the current working status; and
        an output port for outputting the PWM waves to the light emitting device via the driving circuit; and
    the driving circuit is for delivering the PWM waves to the light emitting device from the MCU.

2. The status indicator according to claim 1, wherein the MCU further comprises a nonvolatile memory and a random access memory (RAM).

3. The status indicator according to claim 2, wherein the nonvolatile memory is for storing an interrupt service routine (ISR), and the RAM is for storing a number of elapsed PWM unit periods of a current PWM waveform period, and numbers of PWM unit periods in the peak voltage level of a PWM waveform period of all of a plurality of types of PWM waveforms.

4. The status indicator according to claim 3, wherein the ISR is used to determine whether said number of elapsed PWM unit periods is less than a number of PWM unit periods in the peak voltage level of each PWM waveform period of the type of PWM waveform that corresponds to the current working status of the electronic device.

5. The status indicator according to claim 4, wherein the CPU controls the output port to output a peak voltage to the driving circuit if said number of elapsed PWM unit periods is less than said number of PWM unit periods in the peak voltage level of each PWM waveform period of the type of PWM waveform that corresponds to the current working status of the electronic device.

6. The status indicator according to claim 4, wherein the CPU controls the output port to output a low voltage to the driving circuit if said number of elapsed PWM unit periods is equal to or greater than said number of PWM unit periods in the peak voltage level of each PWM waveform period of the type of PWM waveform that corresponds to the current working status of the electronic device.

7. The status indicator according to claim 1, wherein the MCU further comprises a PWM register which is used to record a number of PWM unit periods in the peak voltage level of each PWM waveform period of one type of PWM waveform which corresponds to the current working status of the electronic device.

8. The status indicator according to claim 7, wherein the MCU further comprises a counter which measures time on the basis of PWM unit periods.

9. The status indicator according to claim 1, wherein the light emitting device is a light emitting diode.

10. A method for indicating multi-working statuses of an electronic device by using a status indicator, comprising the steps of:
    detecting a current working status of said electronic device from at least two different working statuses thereof;
    generating a type of wave signals corresponding to said current working status of said electronic device, said generated wave signals being pulse-width modulation (PWM) waves having a type of PWM waveforms, said type of PWM waveforms identifying said wave signals from other generable wave signals that have their own types of PWM waveforms and are used to indicate other working statuses of said electronic device, respectively;
    transmitting said type of said wave signals to said status indicator; and
    conducting illumination of said status indicator based on said type of said wave signals to indicate said current working status of said electronic device.

11. The method according to claim 10, wherein a unique number of PWM unit periods which constitute a peak voltage level of said type of PWM waveforms is defined to generate said PWM waves in said generating step.

12. The method according to claim 11, further comprising the step of using a PWM register to record said number of PWM unit periods corresponding to said current working status of said electronic device.

13. The method according to claim 10, wherein variation of said illumination of said status indicator is conductible and includes mode changes of said illumination and changes of brightness of said illumination in said conducting step.

14. The method according to claim 10, wherein a counter is used to generate time signals and interruptible to execute an interrupt service routine (ISR) for generation of said wave signals during said generating step.

15. A method for indicating multi-working statuses of an electronic device using a single status indicator, comprising the steps of:
    (a) detecting a current working status of the electronic device and obtaining a number of pulse-width modulation (PWM) unit periods in a peak voltage level of each PWM waveform period of a type of PWM wave that corresponds to the current working status;
    (b) executing an interrupt service routine (ISR), comprising:
        determining whether a number of elapsed PWM unit periods of a current PWM waveform is less than the number of PWM unit periods in the peak voltage level of each PWM waveform period of the type of PWM wave that corresponds to the current working status; and outputting a peak voltage and applying the peak voltage to the signal status indicator if the determination is "yes;" or outputting a low voltage and applying the low voltage to the signal status indicator if the determination is a "no;" and (c) emitting light by the status indicator in a mode by use of the PWM wave that corresponds to the current working status.

16. The indicating method according to claim 15, further comprising the step of interrupting a counter for a PWM waveform period in order to execute step (b).

17. The indicating method according to claim 16, further comprising the step of resuming the counter after step (b) is executed.

* * * * *